United States Patent
Koyata et al.

(10) Patent No.: US 7,403,549 B2
(45) Date of Patent: Jul. 22, 2008

(54) WAVELENGTH CONVERSION LASER AND IMAGE DISPLAY

(75) Inventors: Yasuharu Koyata, Tokyo (JP); Yoshihito Hirano, Tokyo (JP); Masao Imaki, Tokyo (JP); Kouhei Teramoto, Tokyo (JP); Shigenori Shibue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 146 days.

(21) Appl. No.: 10/554,248

(22) PCT Filed: Oct. 1, 2003

(86) PCT No.: PCT/JP03/12601

§ 371 (c)(1), (2), (4) Date: Oct. 25, 2005

(87) PCT Pub. No.: WO2005/033791

PCT Pub. Date: Apr. 14, 2005

(65) Prior Publication Data

US 2006/0256829 A1 Nov. 16, 2006

(51) Int. Cl.
 *H01S 3/10* (2006.01)
 *H01S 5/00* (2006.01)
(52) U.S. Cl. ............ 372/21; 372/22; 372/50.11
(58) Field of Classification Search ............ 372/21, 372/22, 49.01, 50.11, 99, 102
See application file for complete search history.

(56) References Cited

U.S. PATENT DOCUMENTS

| | | | |
|---|---|---|---|
| 4,809,291 A * | 2/1989 | Byer et al. ............ 372/75 |
| 5,117,126 A * | 5/1992 | Geiger ............ 359/330 |
| 5,128,948 A * | 7/1992 | Papuchon et al. ............ 372/21 |
| 5,130,844 A | 7/1992 | Okazaki |
| 5,199,097 A | 3/1993 | Shinokura et al. |
| 5,307,359 A | 4/1994 | Sarraf |
| 5,390,210 A | 2/1995 | Fouquet et al. |
| 5,418,802 A * | 5/1995 | Chwalek ............ 372/20 |
| 5,764,663 A | 6/1998 | Ouchi et al. |
| 5,835,650 A | 11/1998 | Kitaoka et al. |

(Continued)

FOREIGN PATENT DOCUMENTS

JP   63-121829   5/1988

(Continued)

OTHER PUBLICATIONS

Stryckman et al., "Improvement of the lateral-mode discrimination of broad-area diode lasers with a profiled reflectivity output facet", Applied Optics, vol. 35, No. 30, Oct. 1996, p. 5955-5959.

(Continued)

*Primary Examiner*—Armando Rodriguez
(74) *Attorney, Agent, or Firm*—Leydig, Voit & Mayer, Ltd.

(57) ABSTRACT

A wavelength converting laser device includes a laser diode producing laser light and including an optical resonator having a pair of facing reflectors, including a reflecting surface having a shape reducing loss in the optical resonator, with regard to a specific horizontal transverse mode of laser light as compared to the loss in the optical resonator for other horizontal transverse modes, and a wavelength converter for converting the laser light into harmonic light.

11 Claims, 16 Drawing Sheets

U.S. PATENT DOCUMENTS

| | | | |
|---|---|---|---|
| 5,856,814 A * | 1/1999 | Yagyu | 345/89 |
| 5,936,985 A | 8/1999 | Yamamoto et al. | |
| 2002/0159486 A1 | 10/2002 | Yakayama | |
| 2003/0147445 A1 | 8/2003 | Zeitner et al. | |

FOREIGN PATENT DOCUMENTS

| | | |
|---|---|---|
| JP | 1-96983 | 4/1989 |
| JP | 05-267772 | 10/1993 |
| JP | 06-2655951 | 9/1994 |
| JP | 07-28112 | 1/1995 |
| JP | 07-270632 | 10/1995 |
| JP | 2000-347235 | 12/2000 |
| JP | 2000-353842 | 12/2000 |
| JP | 2003-140213 | 5/2003 |

OTHER PUBLICATIONS

Morimoto et al., "Broad-area Laser and the Proposal of Improvement Methods", The transactions of the Institute of Electric C, vol. J84-C, No. 1, Jan. 2001, pp. 17-24.

Improvement of the lateral-mode discrimination of broad-area diode lasers with a profiled reflectivity output facet, Stryckman et al., pp. 5955-5959 (Oct. 1996).

Electro-optic tuning of the phase mismatch in quasi-phase-matched frequency doubling waveguides, Watts et al., pp. 3793-3795 (1996).

Semiconductor laser with curved deep-etched distributed Bragg reflectors supporting a planar Gaussian mode, Modh et al., (2000).

* cited by examiner

WAVELENGTH CONVERSION LASER AND IMAGE DISPLAY

TECHNICAL FIELD

The present invention is related to a laser device and is especially related to wavelength conversion technology which can convert a laser to a short-wavelength laser.

BACKGROUND ART

Recently, as a light source used in the field of optical information processing, research and development of a producing visible laser, such as green and blue laser has been proceeding. As one kind of visible laser, a wavelength converting laser device which converts near-infrared laser into short-wavelength laser by wavelength conversion is known.

Generally speaking, a wavelength converting laser device includes, a wavelength converter including a nonlinear optical material disposed either inside or outside of an optical resonator for a laser diode or a solid-state laser. A laser (a fundamental wave) generated by the optical resonator is output as a second harmonic wave which has a one-half wavelength (double the frequency) of the fundamental wave as a result of propagation of the fundamental wave through the nonlinear optical material.

Published Japanese patent application S63-121829 provides an example of this sort of wavelength converting laser device. Especially in a wavelength converting laser device of embodiment three and FIG. 3 of that publication, an optical resonator is provided by connecting a laser diode and a wavelength converter and forming a reflector at the one facet thereof in an integrated structure. High conversion efficiency is achieved through increased intensity of light by placing the wavelength converter within the optical resonator, even if the pump source is small and low power and produces continuous-wave light, as laser diodes.

However, there is a limit to the power that can be obtained with such a wavelength converting laser device, since this wavelength converting laser device includes a laser diode and a wavelength converter. It is impossible to produce a Watt-level laser (fundamental wave) with a narrow stripe semiconductor lasers having a small light emitting area. On the other hand, since a mode control of a horizontal transverse mode horizontal to an active layer (horizontal transverse mode) is not achieved in a broad-area laser diode having a large light emitting area and Watt-level power, that laser oscillates with multitude transverse modes and has low beam quality. Where this sort of broad-area laser diode is used, it is impossible to obtain a highly efficient wavelength converting laser device since a laser (fundamental wave) with low beam quality has insufficient coupling efficiency or insufficient angle-turned phase matching with the wavelength converter.

As described above, it is impossible for previous wavelength converting laser device to produce a laser having Watt-level power and high efficiency at the same time.

It is an objective of this invention to solve the above mentioned problem of the previous wavelength converting laser device.

DISCLOSURE OF THE INVENTION

A wavelength converting laser device according to the invention comprises a laser diode including an optical resonator having a pair of facing reflectors with a reflecting surface which reduces loss in optical resonator with regard to a specific horizontal transverse mode of a laser as compared to loss in optical resonator for other horizontal transverse modes and comprises a wavelength converter whereby the wavelength of the laser is converted into a harmonic.

As stated above, this wavelength converting laser device using a broad-area laser diode having a large light emitting area and Watt-level power output, oscillates with a high beam quality transverse mode through mode control of the horizontal transverse mode by the optical resonator. Therefore, the laser (fundamental wave) having Watt level power output as well as high beam quality achieves sufficient coupling efficiency or angle-turned phase matching with the wavelength converter and achieves highly efficient wavelength conversion.

BEST MODE FOR CARRYING OUT THE INVENTION

Embodiment 1

A wavelength converting laser device in accordance with the first embodiment of this invention includes a laser diode and a wavelength converter disposed in an optical resonator. A laser (fundamental wave) oscillating within the optical resonator is output after wavelength conversion into a harmonic by the wavelength converter. Vertical transverse mode of the laser (fundamental wave) and the harmonic is controlled by an optical waveguide structure. The horizontal transverse mode of the laser (fundamental wave) and the harmonic is controlled by the optical resonator.

Figure 1A:
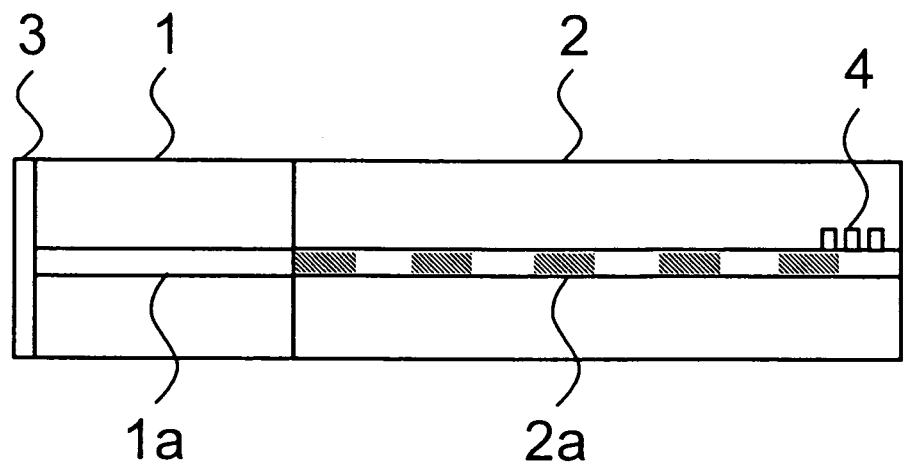
FIG. 1(a) is a cross section parallel to vertical direction showing structure of a wavelength converting laser device in accordance with a first embodiment of the invention.
Figure 1B:
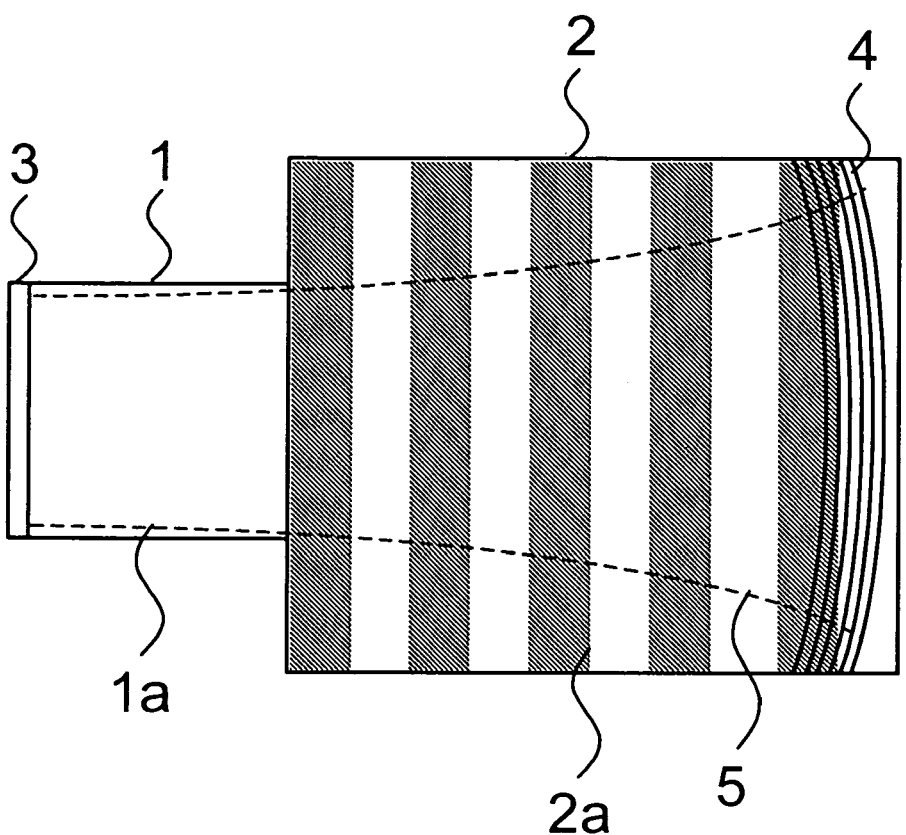
FIG. 1(b) is a cross section parallel to horizontal direction showing the structure of the wavelength converting laser device in accordance with the first embodiment of the invention.
Figure 2A:
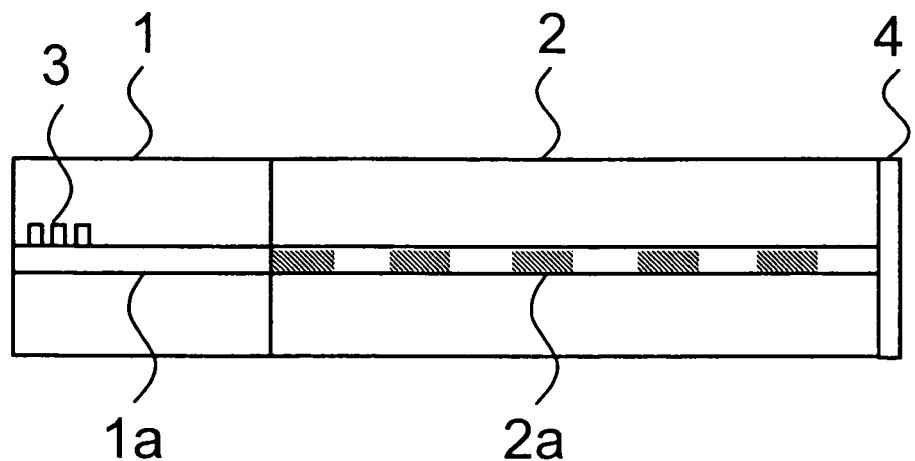
FIG. 2(a) is a cross section parallel to vertical direction showing structure of the wavelength converting laser device in accordance with the first embodiment of the invention.
Figure 2B:
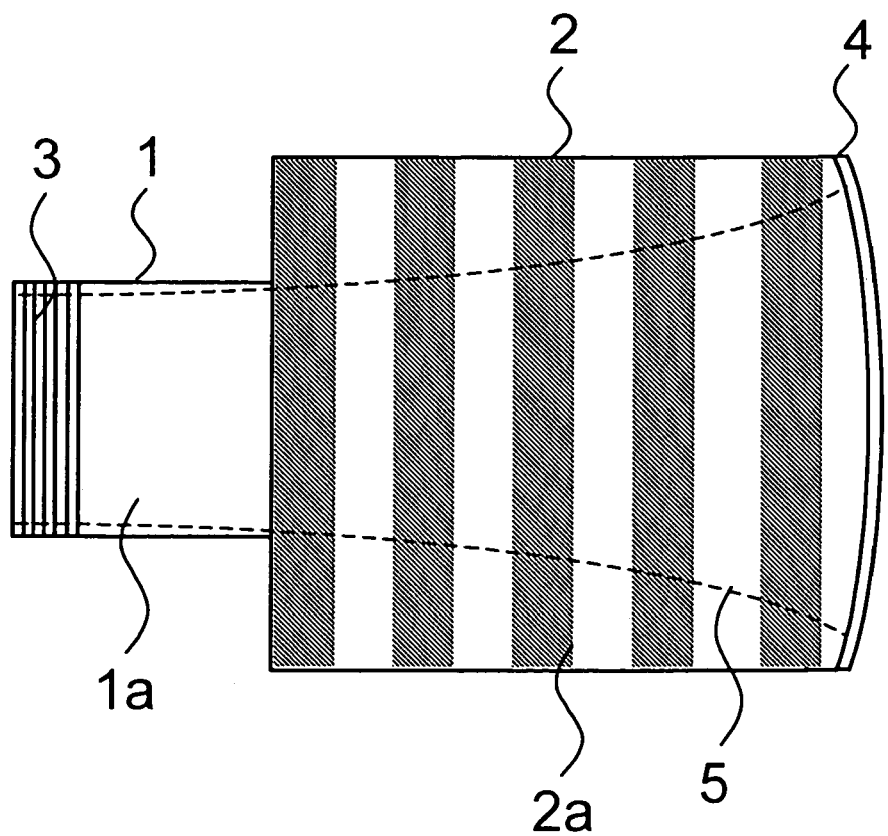
FIG. 2(b) is a cross section parallel to horizontal direction showing structure of the wavelength converting laser device in accordance with the first embodiment of the invention.

FIG. 1 and FIG. 2 shows a structure of the wavelength converting laser device of the first embodiment of the invention. In addition, (a) illustrates a vertical cross-sectional view of the structure of the wavelength converting laser device perpendicular to an active layer of the laser diode, and (b) illustrates a horizontal cross-sectional view of the structure of the wavelength converting laser device horizontal to an active layer of the laser diode.

In the FIG. 1, the active layer 1a made of, for example, an InGaAs-based compound semiconductor is formed in a laser diode 1. The active layer 1a has a thickness of about 1 μm and provides a slab waveguide which controls vertical transverse mode of a laser (fundamental wave). A pn junction is formed at boundaries of the active layer 1a. The stripe width of the active layer is 200 μm, it is a so-called broad-area, and has a high power output characteristic with an output power of more than 5 Watts. Further, the length of the laser diode 1 in the direction axis direction of the optical resonator is 4 mm and the laser diode 1 has a gain bandwidth of about 3 nm, centering around a wavelength of 946 nm. The wavelength converter 2 is made of, for example, MgO:LiNbO3 crystal having a periodically domain-inversed structure, and the z-axis of the crystal is aligned with a horizontal direction of the active layer 1a. The wavelength converter 2 has a slab waveguide 2a comparable in thickness to the thickness of the active layer 1a of the laser diode 1 and having a wide width controlling the vertical transverse mode of the laser (fundamental wave) and a harmonic. Besides, length of the wavelength converter in the direction axis direction of the optical resonator is 10 mm. The periodically domain-inversed structure, as illustrated by the striped pattern in the figures, has a domain-inversed period of 4.6 μm in the direction axis direction. Further, the active layer 1a of the laser diode 1 and the slab waveguide 2a of the wavelength converter 2 are connected on their faces. The Reference number 3 indicates a first reflector, and reference number 4 indicates a second reflector. These reflectors are part of the optical resonator and the wavelength converter 2 is disposed within the optical resonator. The first reflector 3 is formed on a one facet of the laser diode 1 in an integrated structure and provides a coating which almost totally reflects light at a wavelength of 946 nm. The second reflector 4 is integrated with the wavelength converter 2 and is a distributed-reflectance-Bragg-grating-reflector (hereinafter called grating) which almost totally reflects light at a wavelength of 946 nm and has a high transmittance for light at a wavelength of 473 nm. Besides, the second reflector 4 has a 180 mm radius of curvature in the horizontal direction in order to control the horizontal transverse mode of the laser diode 1. Furthermore, in order to select a lasing wavelength, the first reflector 3 and the second reflector 4 have reflectance spectra with about 0.02 nm wavelength widths centered around a wavelength of 946 nm. The Reference number 5 illustrates simplified cross section parallel to horizontal direction of the fundamental wave beam traveling back and forth in the optical resonator.

Next, operation of the embodiment is explained.

When forward current is applied to the laser diode 1 from an electrode omitted from the figures, electrons and holes are injected into the active layer 1a and light emission occurs as a result of recombination of the electrons and the holes. In the optical resonator, the first reflector 3 and the second reflector 4 face each other. Then, stimulated emission occurs by forming an inverted population by increasing the injected current, whereby a laser with a wavelength of 946 nm is amplified. This wavelength is corresponding to the reflectance spectra of the first reflector 3 and the second reflector 4. Laser oscillation occurs when amplification gain of the laser exceeds resonator loss, including absorption loss in the laser diode 1, transmission loss in the first reflector 3 and the second reflector 4, and losses due to the wavelength conversion and scattering in the wavelength converter.

At this moment, in the laser diode 1, the vertical transverse mode of the laser (fundamental wave) is controlled by the active layer 1a. The vertical transverse mode of the laser (fundamental wave) and the harmonic is controlled by the slab waveguide 2a in the wavelength converter 2. On the other hand, the horizontal transverse mode of the laser (fundamental wave) and the harmonic is not controlled by the active layer 1a and the slab waveguide 2a. The horizontal transverse mode of the laser (fundamental wave) is controlled by the first reflector 3 and the second reflector 4 which has the 180 nm radius of curvature. The spatial mode of the optical resonator is governed by the stripe width of the active layer and the radius of curvature of the second reflector 4. The laser (fundamental wave) having a horizontal transverse mode with low loss in optical resonator oscillates and a wavefront of the laser (fundamental wave) at the second reflector 4 becomes almost parallel to the reflecting surface.

The broad-area laser diode 1 has a high power output characteristic. It is possible to prevent optical damage and temperature rise at the wavelength converter 2, from occurring by decreasing the power density of the laser (fundamental wave) by expanding the beam dimension in the horizontal direction. Thus, the harmonic can have a high-power. Both of the laser diode 1 and the wavelength converter 2 have an optical waveguide structure. It is possible to make the wavelength conversion in the wavelength converter 2 highly efficient by matching, in the vertical direction, waveguide mode of an optical waveguide comprising the laser diode 1 and the wavelength converter 2, and by decreasing, in the horizontal direction, coupling loss of the laser (fundamental wave) traveling between the laser diode 1 and the wavelength converter 2, as the spectral mode comprising the optical resonator including the pair of the reflectors.

Since, especially due to the slab wave guide 2a of the wavelength converter 2, the power density of the laser (fundamental wave) and harmonic are reduced through expanding the beam dimension horizontally in the wavelength converter 2. Therefore the heat generation caused by light absorption and temperature rising are prevented due to the enlarged heat releasing area.

For this reason, discrepancy in phase matching wavelength caused by temperature rise is reduced and makes the wavelength conversion in the wavelength converter 2 highly effective.

In addition, because the wavelength converter 2 has the periodically domain-inversed structure, quasi-phase matching arises for the propagating harmonic, so it is possible to make the wavelength conversion in the wavelength converter 2 highly effective.

By the way, since the refractive index of nonlinear optical material is wavelength dispersive, phase velocity is different between the fundamental wave and the second harmonic wave and the second harmonic wave generated at each point propagates with a phase difference between each harmonic. When the second harmonic wave generated at each point propagates beyond a coherence length lc, which providing a difference of $\pi$, the intensity of a synthesized harmonic decreases. Therefore, the intensity increases and decreases with a period of the coherence length. So, in the periodically domain-inversed structure, The sign of a nonlinear optical constant of the nonlinear optical material, i.e., a direction of spontaneous polarization of a ferroelectric material, is reversed with a period of the coherence length. When the wavelength of the fundamental wave is $\lambda 1$, the wavelength of the second harmonic wave is $\lambda 2$, refractive index of the nonlinear optical material at the fundamental wave is n1, refractive index at the second harmonic wave is n2, and it is assumed that wave number vector of the fundamental wave $k1=(2\pi n1/\lambda 1)$, wave number vector of the second harmonic wave $k2=(2\pi n2/\lambda 2)$, and phase mismatching amount $\Delta k=2k1-k2$, then the coherence length lc is represented by $$lc=\pi/\Delta k=\lambda 1/4/(n1-n2) \qquad (1)$$

The phase of the second harmonic wave reverses in the period of coherence length and this becomes Quasi-Phase Matching compensating the phase of a synthesized harmonic and its intensity increases, in an additive manner, to generate the second harmonic wave efficiently.

As to the periodically domain-inversed structure, periodic pattern electrodes are formed on a substrate surface of the nonlinear optical material, so the polarization is inverted by applying a voltage exceeding the hold voltage of the ferroelectric material by the electric field application method. It is manufactured at interval of the coherence length, which is at a micron order, by applying the process technology for semiconductor.

When LiNbO3 crystal, which has a large nonlinearity coefficient, is used as the nonlinear optical material, highly efficient wavelength conversion is performed at d33, which is the largest component of the nonlinearity coefficient in the Quasi-Phase Matching.

However, there is a limit in obtaining high power output, because the LiNbO3 crystal readily suffers an optical damage so the power density of the fundamental wave is restricted. When MgO doped MgO:LiNbO3 crystal is used, resistace against optical damage increases and it makes possible to obtain high power.

In addition, since the polarization of the laser (fundamental wave) traveling back and force within the optical resonator is defined in the horizontal direction, it is possible to make the wavelength conversion in the wavelength converter highly efficient by aligning the z-axis of crystal axis having the greatest nonlinearity coefficient of the MgO:LiNbO3 crystal and the direction of polarization of the laser (fundamental wave).

The interval of longitudinal modes of the laser (fundamental wave) depends on the length of the optical resonator and is 0.013 nm, which is sufficiently small.

A longitudinal mode in the vicinity of wavelength 946 nm and within the wavelength width of the reflectance spectra of the first reflector 3 and the second reflector 4 is selected as a lasing wavelength of the laser (fundamental wave).

In order to select the longitudinal mode, the second reflector 4 includes the grating. Therefore, it is possible to make the wavelength conversion in the wavelength converter 2 highly efficient by reducing the phase mismatch of the harmonic by matching the phase matching wavelength of the wavelength converter 2 and the lasing wavelength of the laser (fundamental wave). Since the interval of the longitudinal modes is small enough, it is possible to control the lasing wavelength of the laser (fundamental wave) to be set sufficiently near the phase matching wavelength.

Since the first reflector 3 and the second reflector 4 are integrated in the optical waveguide including the laser diode 1 and the wavelength converter 2, diffraction loss of the laser (fundamental wave) traveling back and force within the optical resonator by reflecting toward the optical wave guide by the first reflector, 3 and the second reflector 4 can be reduced. Therefore it is possible to make the harmonic high power by the laser (fundamental wave) oscillating with high power.

Since the laser (fundamental wave) is not output outside of the optical resonator and keeps confined within the optical resonator by the total reflection of the first reflector 3 and the second reflector 4, only the wavelength-converted harmonic is output outside because of the high transmittance of the second reflector 4. Since the wavelength converter is disposed inside the optical resonator within which the laser (fundamental wave) with high power is confined, the harmonic which is produced by wavelength conversion with high efficiency is output with high power.

As stated above, the wavelength of the laser (fundamental wave) with a wavelength of 946 nm is converted at high efficiency, the harmonic with a wavelength of 473 nm is output with high power of 3 Watt.

Besides, as illustrated in FIG. 2, it is acceptable to interchange the coating and grating as to the first reflector 3 and the second reflector 4. In FIG. 2, the first reflector 3 is formed on the laser diode 1 in an integrated manner, as is the grating, which almost totally reflects light with a wavelength of 946 nm. The second reflector 4 is a coating integrated at the facet of wavelength converter 2 and almost totally reflects light at a wavelength of 946 nm and has a high transmittance for light at a wavelength of 473 nm. The coating representing the second reflector 4 is formed on the curved surface of the facet of the wavelength converter 2, and has a radius of curvature of 180 nm in the horizontal direction in order to control the horizontal transverse mode of the laser (fundamental wave).

In addition, the coating of the first reflector 3 and the grating of the second reflector 4 have reflectance spectra with about a 0.02 nm wavelength bandwidths centered around the wavelength of 946 nm in order to select a lasing wavelength. The structure as illustrated in FIG. 2 can also provide the same effect as the structure of FIG. 1.

As stated above, the wavelength converting laser device in embodiment 1 of this invention, as to the broad-area laser diode having the large light emitting area and Watt-level power output, makes it possible to produce oscillation with high quality transverse mode through the mode control of the horizontal transverse mode by the optical resonator. Therefore, since the laser (fundamental wave) having Watt level power output as well as high beam quality produces sufficient coupling efficiency, it is possible to achieve wavelength conversion with high efficiency. Further, it is possible to provide a wavelength converting laser device having Watt-level power output as well as high efficiency.

Embodiment 2

A wavelength converting laser device in accordance with the second embodiment of this invention has almost the same structure and operation as the wavelength converting laser device of embodiment 1, but has a difference in an optical resonator.

Figure 3A:
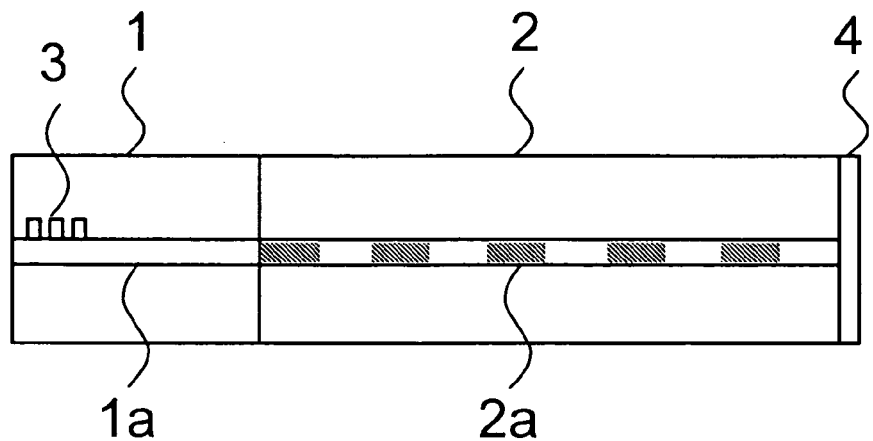
FIG. 3(a) is a cross section parallel to vertical direction showing structure of the wavelength converting laser device in accordance with a second embodiment of the invention.
Figure 3B:
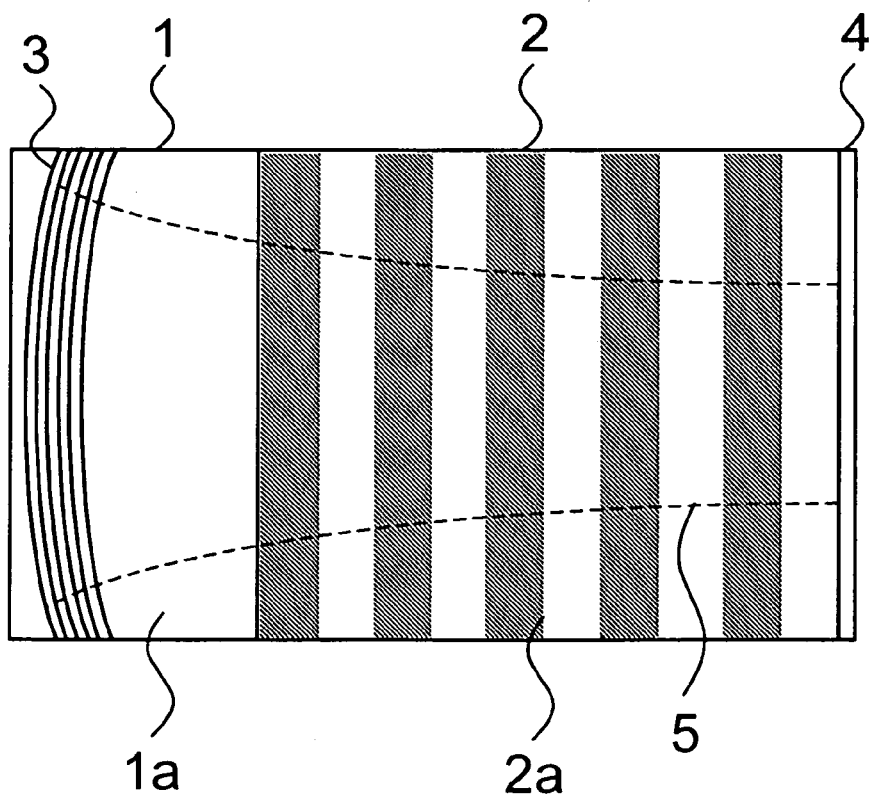
FIG. 3(b) is a cross section parallel to horizontal direction showing structure of the wavelength converting laser device in accordance with the second embodiment of the invention.

FIG. 3 shows a structure of the wavelength converting laser device in accordance with the second embodiment of this invention. Here, (a) illustrates a vertical cross-sectional view of the structure of the wavelength converting laser device perpendicular to an active layer of the laser diode, and (b) illustrates a horizontal cross-sectional view of the structure of the wavelength converting laser device horizontal to an active layer of the laser diode. In addition, the same reference number indicates the same or a corresponding part in the Figures.

In FIG. 3, the first reflector 3 is integrated with the laser diode 1, and is a grating which almost totally reflects light at a wavelength of 946 nm. The second reflector 4 is integrated on a one facet of the wavelength converter 2 and is a coating which almost totally reflects light at a wavelength of 946 nm and has a high transmittance for light at a wavelength of 473 nm. Further, the grating of the first reflector 3 has a 170 mm radius of curvature in the horizontal direction in order to control the horizontal transverse mode.

As in the case of embodiment 1, the vertical transverse mode of the laser (fundamental wave) is controlled by an optical waveguide structure including a laser diode 1 and a wavelength converter 2. On the other hand, the horizontal transverse mode of the laser (fundamental wave) is controlled by the first reflector 3 having a 170 mm radius of curvature and the second reflector 4. Here, the spatial mode of the optical resonator is governed by the stripe width of the active layer and the radius of curvature of the first reflector 3. The laser (fundamental wave) having a horizontal transverse mode with low loss in optical resonator oscillates and a wavefront of the laser (fundamental wave) at the first reflector 3 becomes almost parallel to the reflecting surface.

Furthermore, although figures are omitted, the first reflector 3 may be a coating having a 170 mm radius of curvature and the second reflector 4 may be a grating.

The operation of the above mentioned wavelength converting laser device in embodiment 2 is the same as that of the embodiment 1, and has the same effects.

Embodiment 3

A wavelength converting laser device in accordance with the third embodiment of this invention has almost the same structure and operation as the wavelength converting laser device of embodiment 1 and embodiment 2, but has an adjustment means for adjusting a angle-turned phase matching in the wavelength converter.

Figure 4A:
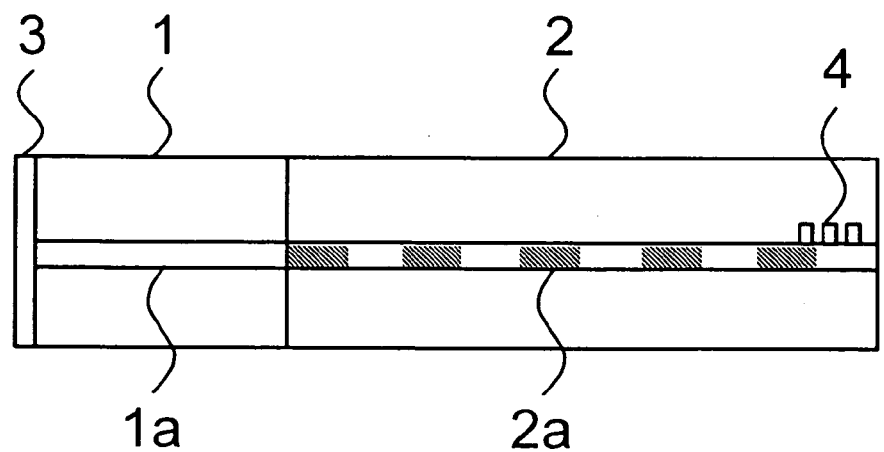
FIG. 4(a) is a cross section parallel to vertical direction showing structure of the wavelength converting laser device in accordance with a third embodiment of the invention.
Figure 4B:
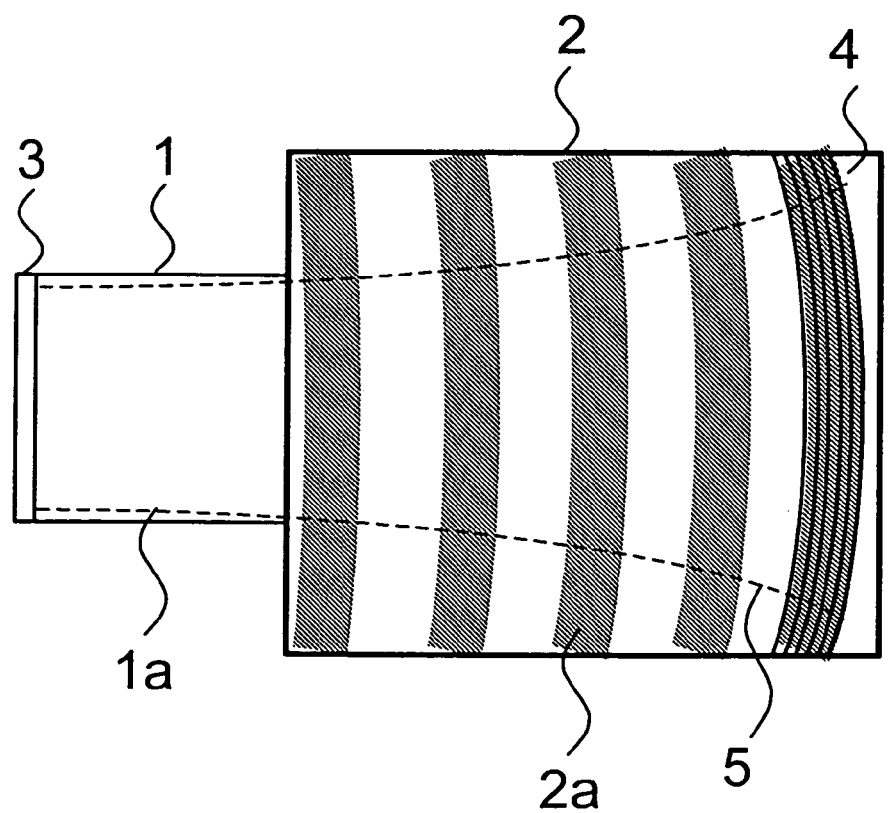
FIG. 4(b) is a cross section parallel to horizontal direction showing structure of the wavelength converting laser device in accordance with the third embodiment of the invention.
Figure 5A:
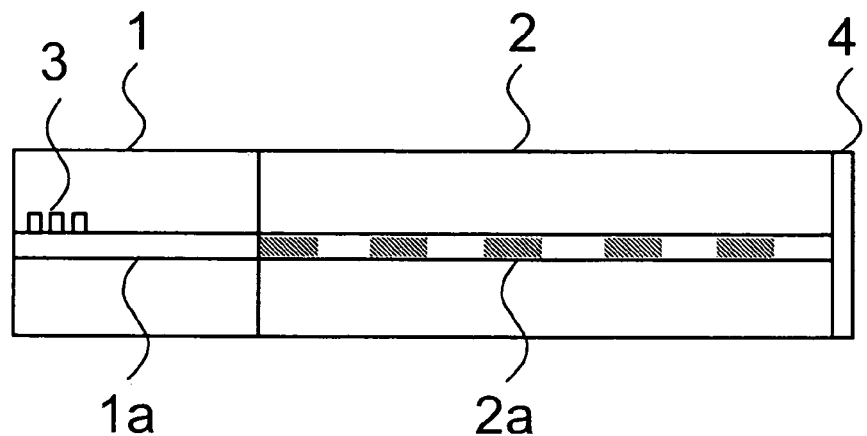
FIG. 5(a) is a cross section parallel to vertical direction showing structure of the wavelength converting laser device in accordance with the third embodiment of the invention.
Figure 5B:
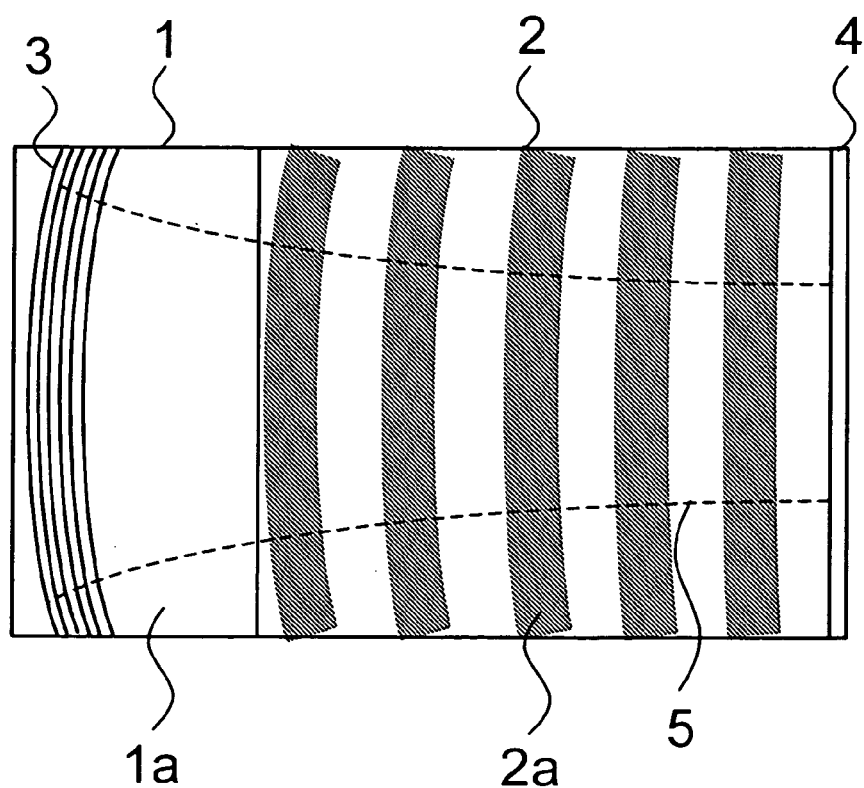
FIG. 5(b) is a cross section parallel to horizontal direction showing structure of the wavelength converting laser device in accordance with the third embodiment of the invention.

FIG. 4 and FIG. 5 show a structure of the wavelength converting laser device in accordance with the third embodiment of this invention. Here, (a) illustrates a vertical cross-sectional view of the structure of the wavelength converting laser device perpendicular to the active layer of the laser diode, and (b) illustrates a horizontal cross-sectional view of the structure of the wavelength converting laser device horizontal to the active layer of the laser diode. In addition, the same reference number indicates the same or a corresponding part in the figures.

In FIG. 4, as a different embodiment than FIG. 1, the laser diode 1 is a broad-area diode having a stripe width of active layer of 100 μm and has a high power output characteristic. Besides, the grating as the second reflector 4 has a 16 mm radius of curvature in the horizontal direction in order to control the horizontal transverse mode. Furthermore, the periodically domain-inversed structure of the wavelength converter 2 has a domain-inversed period of about 4.6 μm and is formed into curved surface shape, almost parallel to a wavefront of the laser (fundamental wave) in the horizontal direction, in order to adjust the angle-turned phase matching.

By the way, a problem of the angle-turned phase matching is that an allowable value of a propagation angle is restricted when the harmonic is performed phase matching and the fundamental wave travels back and forth within the wavelength converter. Therefore, it is necessary to achieve the laser as the fundamental wave having a nice beam quality with a small beam expansion. For example, under the periodically domain-inversed structure having the planar shape as illustrated in FIG. 1 of the embodiment 1, the beam of the fundamental wave expands in a curved surface manner. Thus, when the propagation angles are different between the center portion of the beam and the surrounding portion thereof by δ, the domain-inversed period Λ changes into Λ/cos δ, and this decreases conversion efficiency in the surrounding portion of the beam.

Here, in the wavelength converter 2 of embodiment 3 as illustrated in FIG. 4, the beam of the laser (fundamental wave) expands in the horizontal direction and inclines by up to 0.1 deg. However, since the periodically domain-inversed structure is formed into the curved surface shape so as to be almost parallel to the wavefront of the laser (fundamental wave) in the horizontal direction, the domain-inversed period almost matches the expansion of the beam of the fundamental wave and the harmonic receives a sufficient quasi-phase matching. Thus, it is possible to make the wavelength conversion in the wavelength converter highly efficient.

Also, as described in FIG. 5, as a different embodiment from FIG. 3, the laser diode 1 is a broad-area having a stripe width of active layer of 120 μm and has a high power output characteristic. Besides, the grating as the second reflector 4 has a 14 mm radius of curvature in the horizontal direction in order to control the horizontal transverse mode. Furthermore, the periodically domain-inversed structure of the wavelength converter 2 has a domain-inversed period of 4.6 μm and is formed into curved surface shape, almost parallel to the wavefront of the laser (fundamental wave) in the horizontal direction, in order to adjust the angle-turned phase matching. In the wavelength converter 2, the beam of the laser (fundamental wave) expands in the horizontal direction and inclines by up to 0.06 deg. However it is possible to achieve the same operation and the effect as the case of FIG. 4 by the structure as illustrated in FIG. 5.

As mentioned above, since, in the wavelength converting laser device in accordance with the third embodiment of the invention, the periodically domain-inversed structure is formed into curved surface shape, almost parallel to the wavefront of the laser (fundamental wave), in order to adjust the angle-turned phase matching, it is possible to make the quasi-phase matching sufficient and to achieve the highlly efficient wavelength conversion.

Embodiment 4

A wavelength converting laser device in accordance with the fourth embodiment of the invention has almost the same structure and operation as the wavelength converting laser device of embodiment 3, but includes an optical waveguide device on which a reflector of an optical resonator is formed.

Figure 6A:
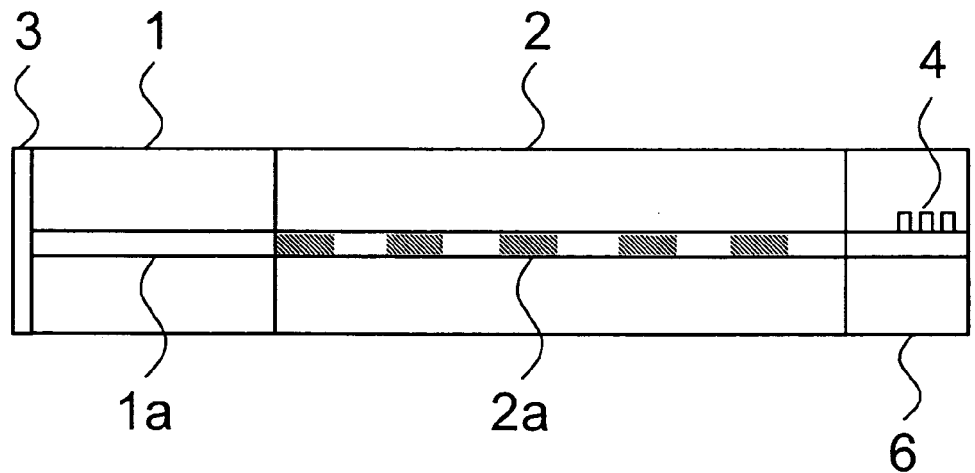
FIG. 6(a) is a cross section parallel to vertical direction showing structure of the wavelength converting laser device in accordance with a fourth embodiment of the invention.
Figure 6B:
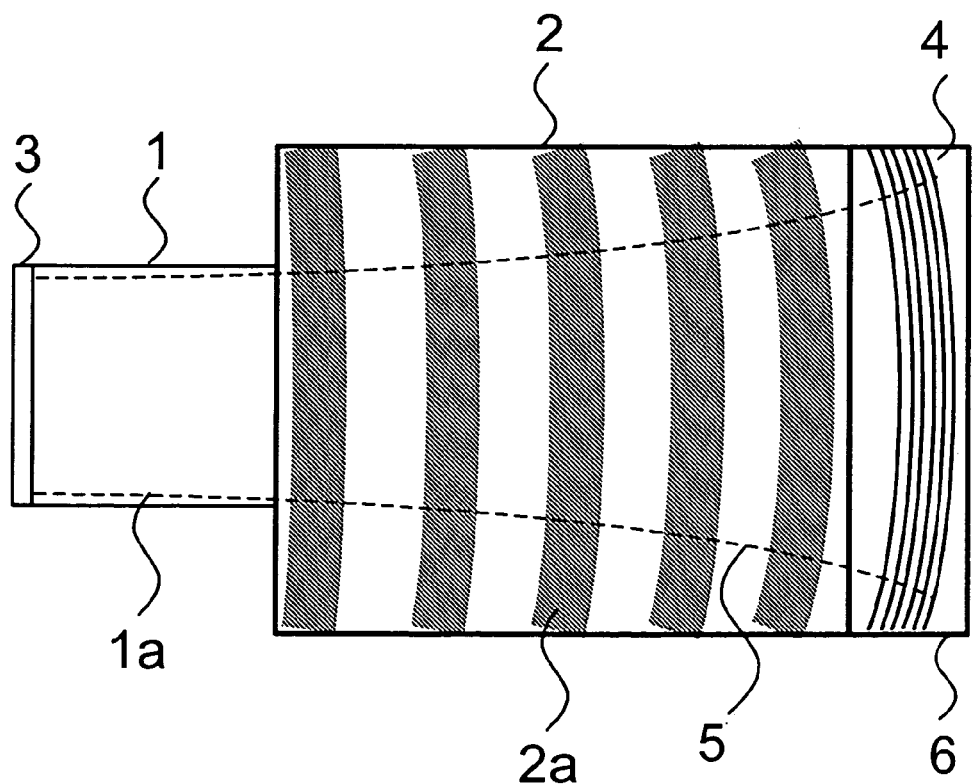
FIG. 6(b) is a cross section parallel to horizontal direction showing structure of the wavelength converting laser device in accordance with the fourth embodiment of the invention.

FIG. 6 shows a structure of the wavelength converting laser device in accordance with the fourth embodiment of this invention. Here, (a) illustrates a vertical cross-sectional view of the structure of the wavelength converting laser device perpendicular to the active layer of the laser diode, and (b) illustrates a horizontal cross-sectional view of the structure of the wavelength converting laser device horizontal to the active layer of the laser diode. In addition, the same reference number indicates the same or a corresponding part in the figures.

In FIG. 6, reference number 6 indicates the optical waveguide device including a slab waveguide 6a having the almost same thickness as that of the slab waveguide 2a of the wavelength converter 2. Besides, the wavelength converter has a length of 5 mm, and the second reflector 4 is a grating integrated on the optical waveguide device and has a 130 mm radius of curvature in the horizontal direction.

Operation of the above mentioned wavelength converting laser device of embodiment 4 is the same as that of embodiment 3, and the effect is also the same. In addition, since the second reflector 4 is formed on the independent optical waveguide device and this allows to select or to change among second reflectors 4 having different design, the flexibility of design for the wavelength converting laser device is improved.

Furthermore, although illustration is omitted, it is acceptable to make the first reflector 3 as a grating integrated on an optical waveguide device which includes a slab waveguide having almost the same thickness as that of the active layer 1a of the laser diode 1. It is possible to achieve the same effects.

Embodiment 5

Figure 7A:
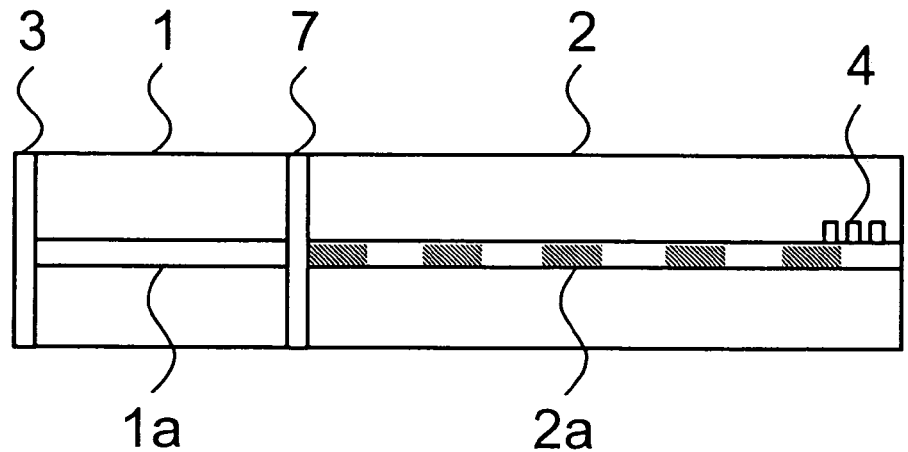
FIG. 7(a) is a cross section parallel to vertical direction showing structure of the wavelength converting laser device in accordance with a fifth embodiment of the invention.
Figure 7B:
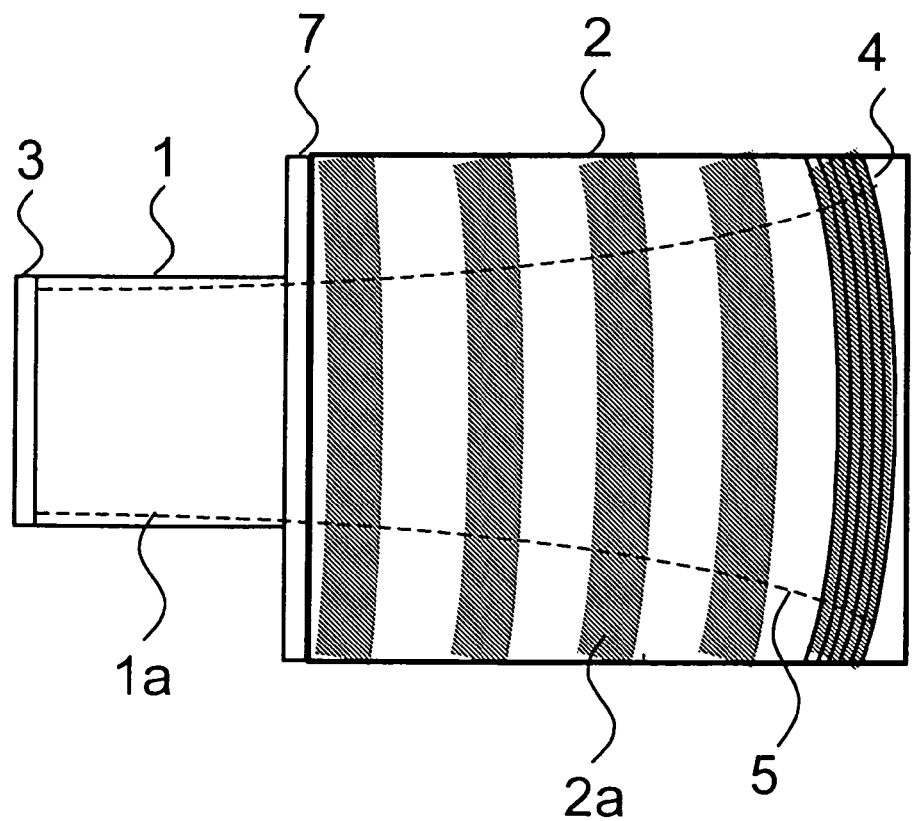
FIG. 7(b) is a cross section parallel to horizontal direction showing structure of the wavelength converting laser device in accordance with the fifth embodiment of the invention.
Figure 8A:
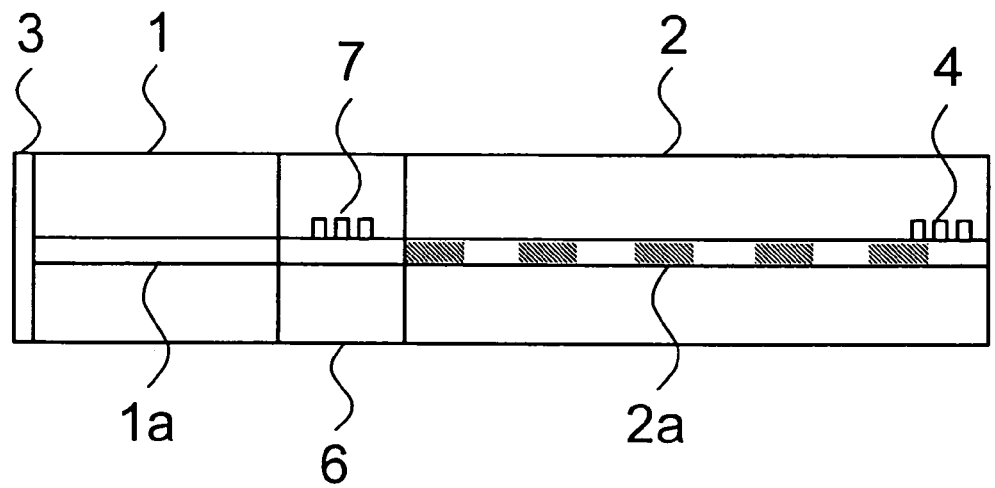
FIG. 8(a) is a cross section parallel to vertical direction showing structure of the wavelength converting laser device in accordance with the fifth embodiment of the invention.
Figure 8B:
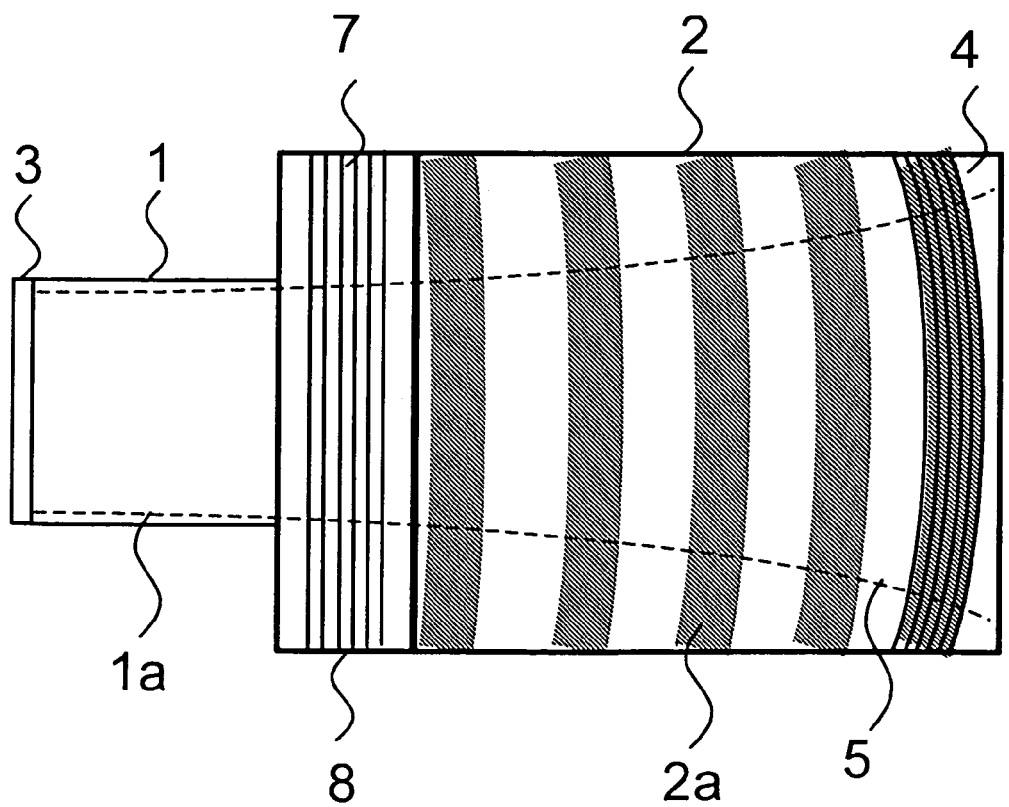
FIG. 8(b) is a cross section parallel to horizontal direction showing structure of the wavelength converting laser device in accordance with the fifth embodiment of the invention.

A wavelength converting laser device in accordance with the fifth embodiment of the invention has almost the same structure and operation as the wavelength converting laser device of embodiment 3, but includes a reflector configured to reflect the harmonic between the laser diode and the wavelength converter. FIG. 7 and FIG. 8 show a structure of the wavelength converting laser device in accordance with the fifth embodiment of this invention. Here, (a) illustrates a vertical cross-sectional view of the structure of the wavelength converting laser device perpendicular to the active layer of the laser diode, and (b) illustrates a horizontal cross-sectional view of the structure of the wavelength converting laser device horizontal to the active layer of the laser diode. In addition, the same reference number indicates the same or a corresponding part in the figures.

In FIG. 7, the reference number 7 indicates a third reflector which is placed between the laser diode 1 and the wavelength converter 2 and which is a coating that almost totally reflects light at a wavelength of 473 nm. Besides, in FIG. 8, the third reflector 7 is formed on an optical waveguide device 6 disposed between the laser diode 1 and the wavelength converter 2 and is a grating that almost totally reflects light at a wavelength of 473 nm.

Under the structure in which the wavelength converter 2 is disposed within the optical resonator, since the laser (fundamental wave) travels back and forth within the optical resonator, the wavelength of the laser propagating towards the direction of the laser diode 1 from the wavelength converter 2 is also converted to the harmonic by the wavelength converter 2. Therefore, it is possible to make producing of the harmonic more highly efficient through reflecting the laser propagating towards the direction of the laser diode 1 from the wavelength converter 2 by the third reflector 7 and outputting them from the second reflector. Furthermore, it is possible to prevent optical damage and temperature rise, caused by absorption of the harmonic in the active layer 1a of the laser diode 1, from occurring, by blocking the incidence of the harmonic into the laser diode 1 by the third reflector 7.

Embodiment 6

A wavelength converting laser device in accordance with the sixth embodiment of the invention has almost the same structure and operation as the wavelength converting laser device of embodiment 5, but includes a vertical transverse mode converting means between the laser diode and the wavelength converter. FIG. 9, FIG. 10, FIG. 11 and FIG. 12 show a structure of the wavelength converting laser device in accordance with the sixth embodiment of this invention. Here, (a) illustrates a vertical cross-sectional view of the structure of the wavelength converting laser device perpendicular to the active layer of the laser diode, and (b) illustrates a horizontal cross-sectional view of the structure of the wavelength converting laser device horizontal to the active layer of the laser diode. In addition, the same reference number indicates the same or a corresponding part in the figures.

Figure 9A:
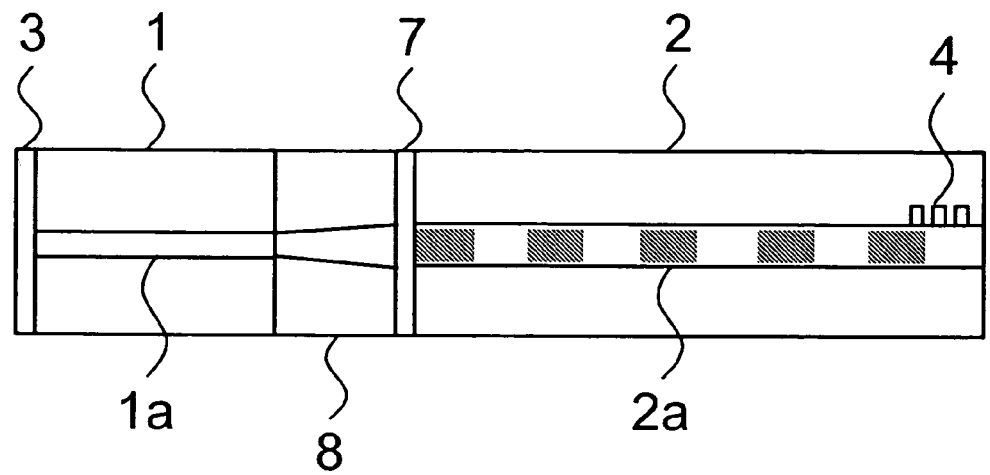
FIG. 9(a) is a cross section parallel to vertical direction showing structure of the wavelength converting laser device in accordance with a sixth embodiment of the invention.
Figure 9B:
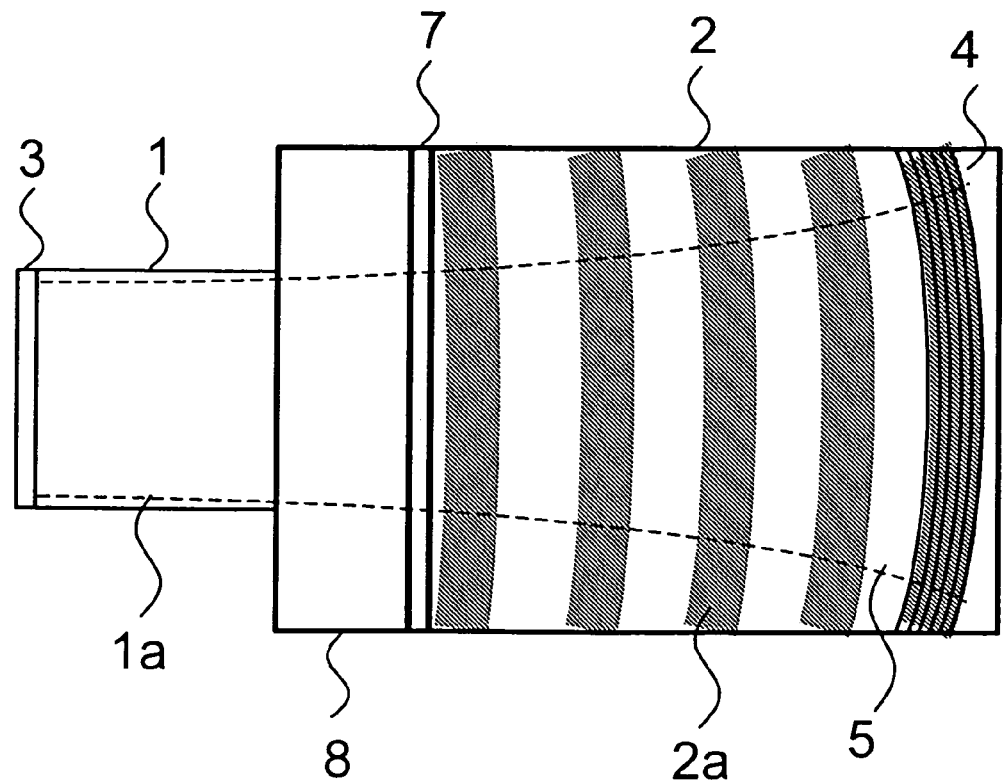
FIG. 9(b) is a cross section parallel to horizontal direction showing structure of the wavelength converting laser device in accordance with the sixth embodiment of the invention.
Figure 10A:
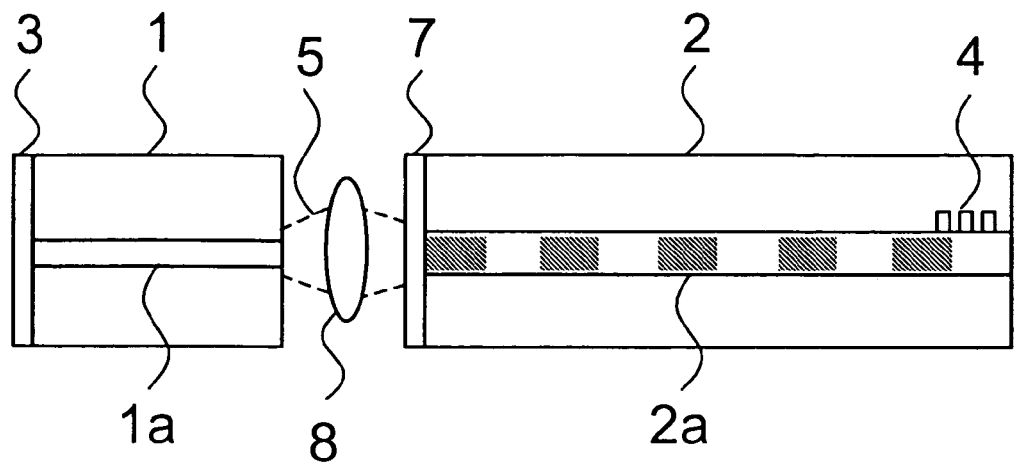
FIG. 10(a) is a cross section parallel to vertical direction showing structure of the wavelength converting laser device in accordance with the sixth embodiment of the invention.
Figure 10B:
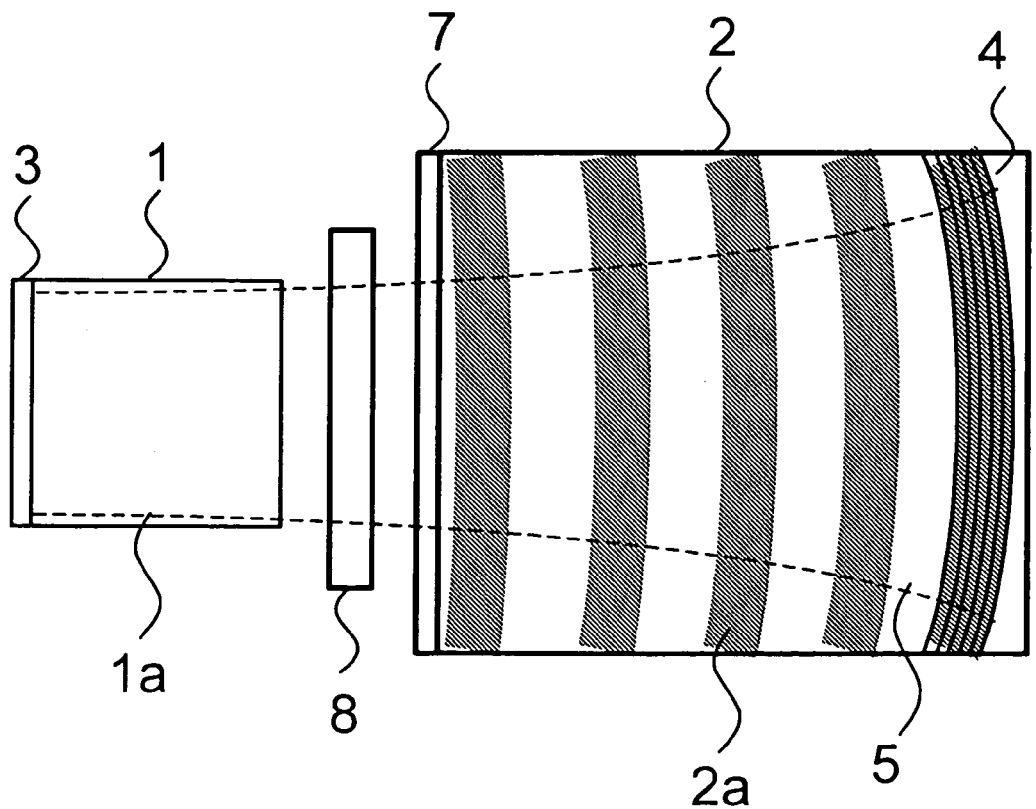
FIG. 10(b) is a cross section parallel to horizontal direction showing structure of the wavelength converting laser device in accordance with the sixth embodiment of the invention.
Figure 11A:
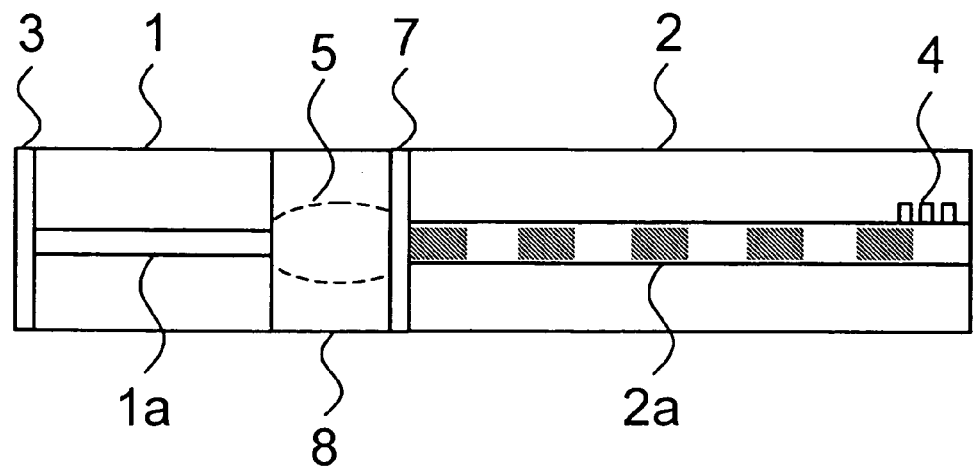
FIG. 11(a) is a cross section parallel to vertical direction showing structure of the wavelength converting laser device in accordance with the sixth embodiment of the invention.
Figure 11B:
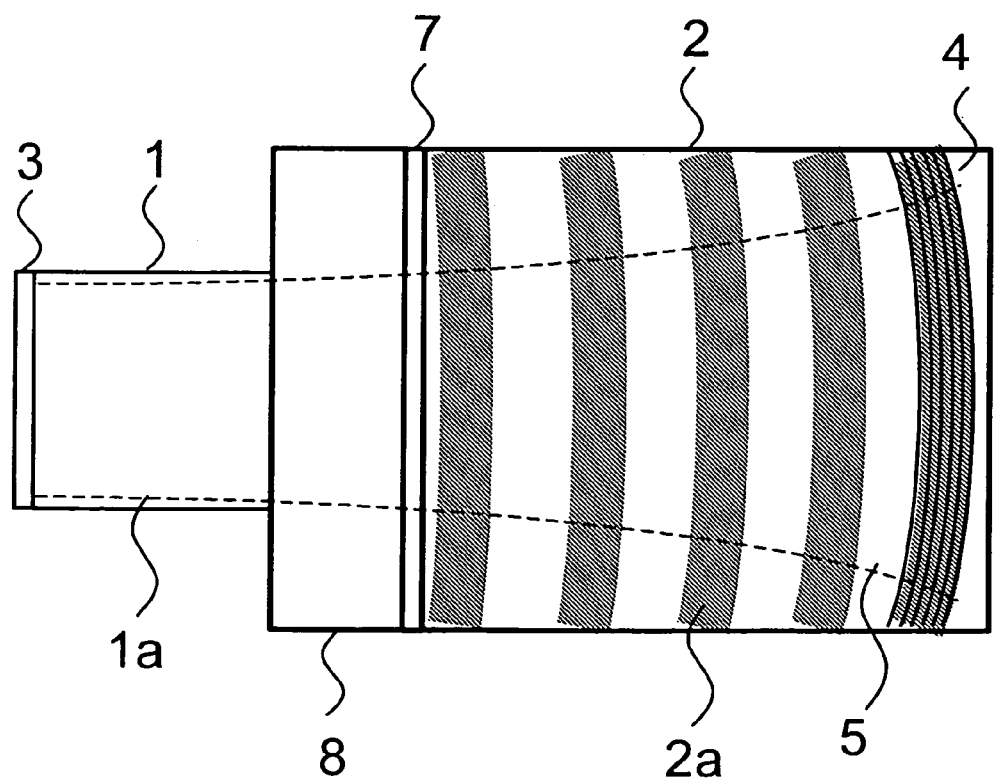
FIG. 11(b) is a cross section parallel to horizontal direction showing structure of the wavelength converting laser device in accordance with the sixth embodiment of the invention.
Figure 12A:
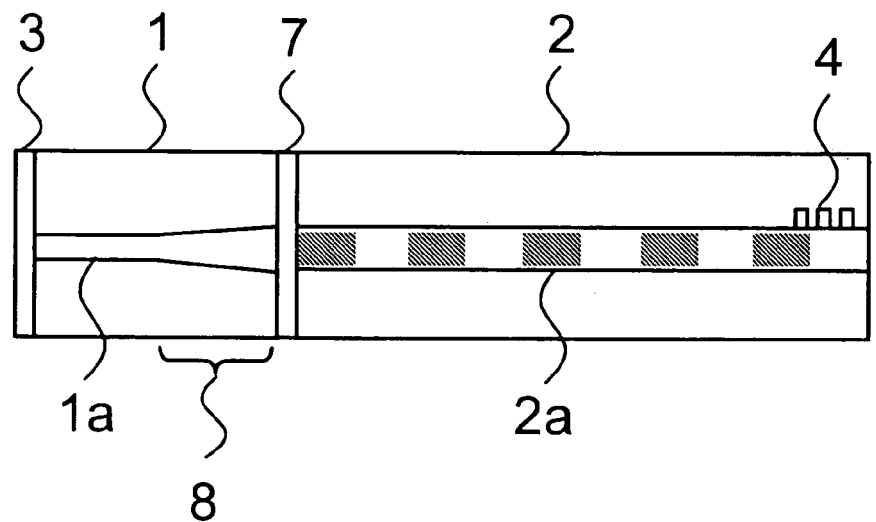
FIG. 12(a) is a cross section parallel to vertical direction showing structure of the wavelength converting laser device in accordance with the sixth embodiment of the invention.
Figure 12B:
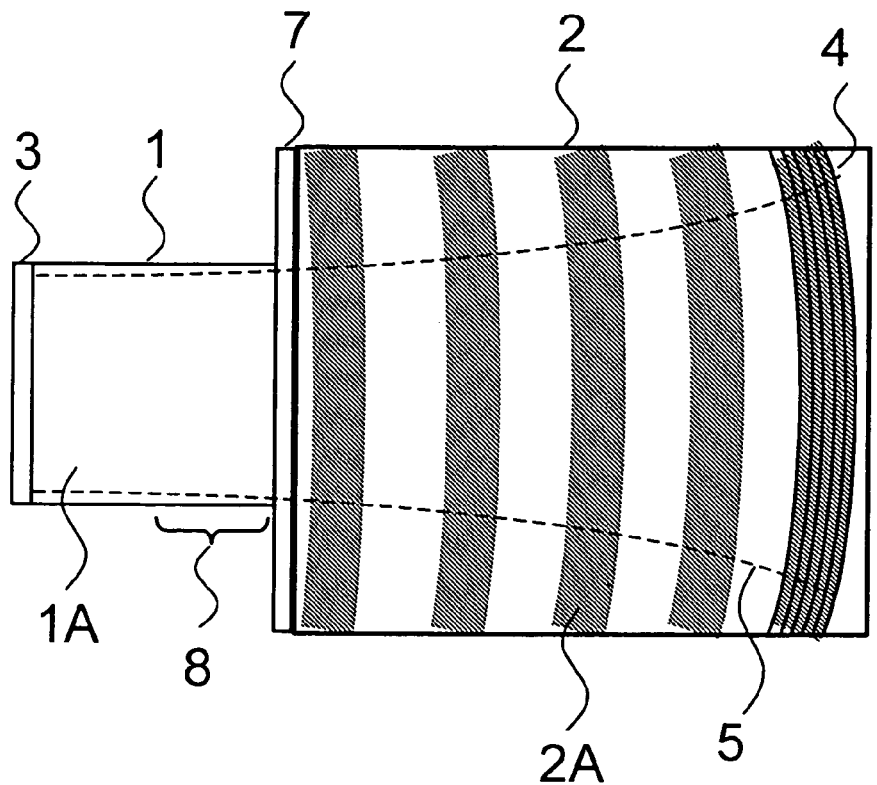
FIG. 12(b) is a cross section parallel to horizontal direction showing structure of the wavelength converting laser device in accordance with the sixth embodiment of the invention.

In FIG. 9, the thickness of the slab waveguide of the laser diode 1 is different than that of the slab waveguide of the wavelength converter. The reference number 8 estimates transverse mode converting means in which a thickness of a slab waveguide formed on an optical waveguide changes gradually. In FIG. 10, the wavelength converting laser device includes, as the transverse mode converting means 8, a cylindrical lens having a curved surface only in the vertical direction. In FIG. 11, the wavelength converting laser device includes, as the transverse mode converting means 8, a graded-index-type lens having a distribution of the refractive index under which the reflection gradually decreases in the vertical direction. In FIG. 12, a thickness of the active layer 1a of the laser diode 1 changes gradually as the transverse mode converting means 8. When the thickness and distribution of the refractive index of the slab waveguide are different between the laser diode 1 and the wavelength converter 2, a mode mismatching between the vertical transverse mode of the laser in the laser diode 1 and the vertical transverse mode of the laser in the wavelength converter 2 occurs. Therefore, it is possible to decrease the coupling loss of the laser (fundamental wave) propagating between the laser diode 1 and the wavelength converter 2 and possible to make the wavelength conversion in the wavelength converter highly effective, through respectively adjusting, by the transverse mode converting means 8, beam diameter, expansion angle and wavefront of the laser (fundamental wave) entering the slab waveguide of the laser diode 1 and the wavelength converter 2.

Embodiment 7

Figure 13A:
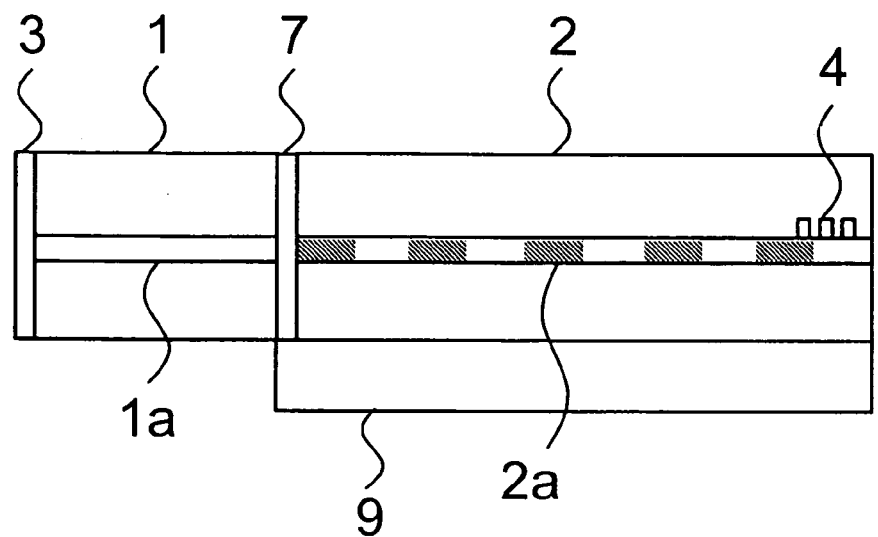
FIG. 13(a) is a cross section parallel to vertical direction showing structure of the wavelength converting laser device in accordance with a seventh embodiment of the invention.
Figure 13B:
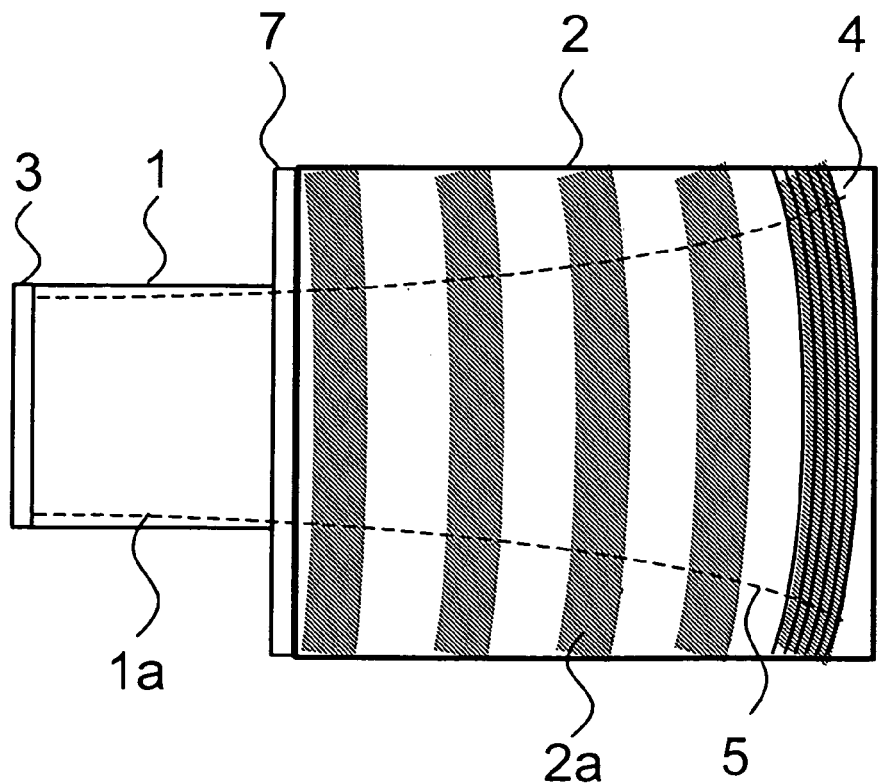
FIG. 13(b) is a cross section parallel to horizontal direction showing structure of the wavelength converting laser device in accordance with the seventh embodiment of the invention.
Figure 14A:
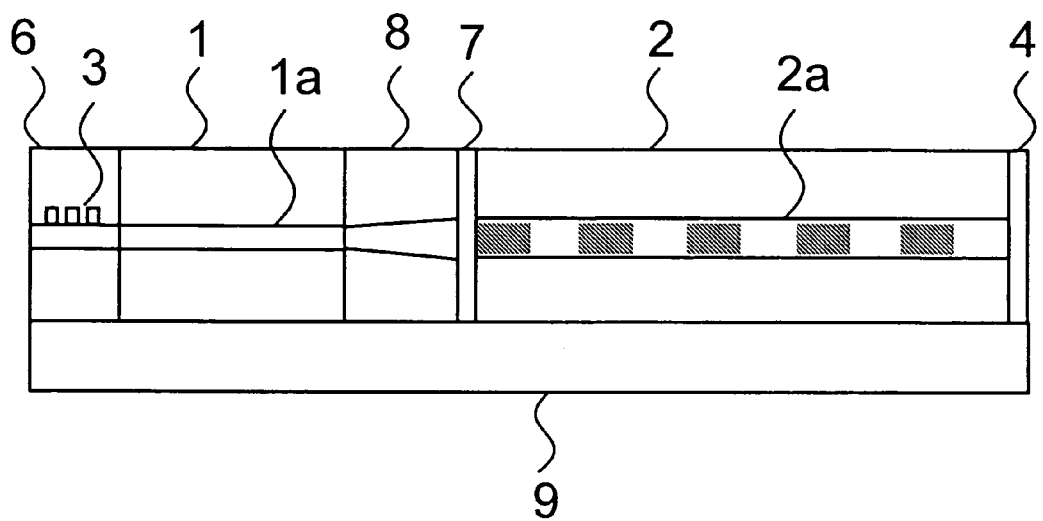
FIG. 14(a) is a cross section parallel to vertical direction showing structure of the wavelength converting laser device in accordance with the seventh embodiment of the invention.
Figure 14B:
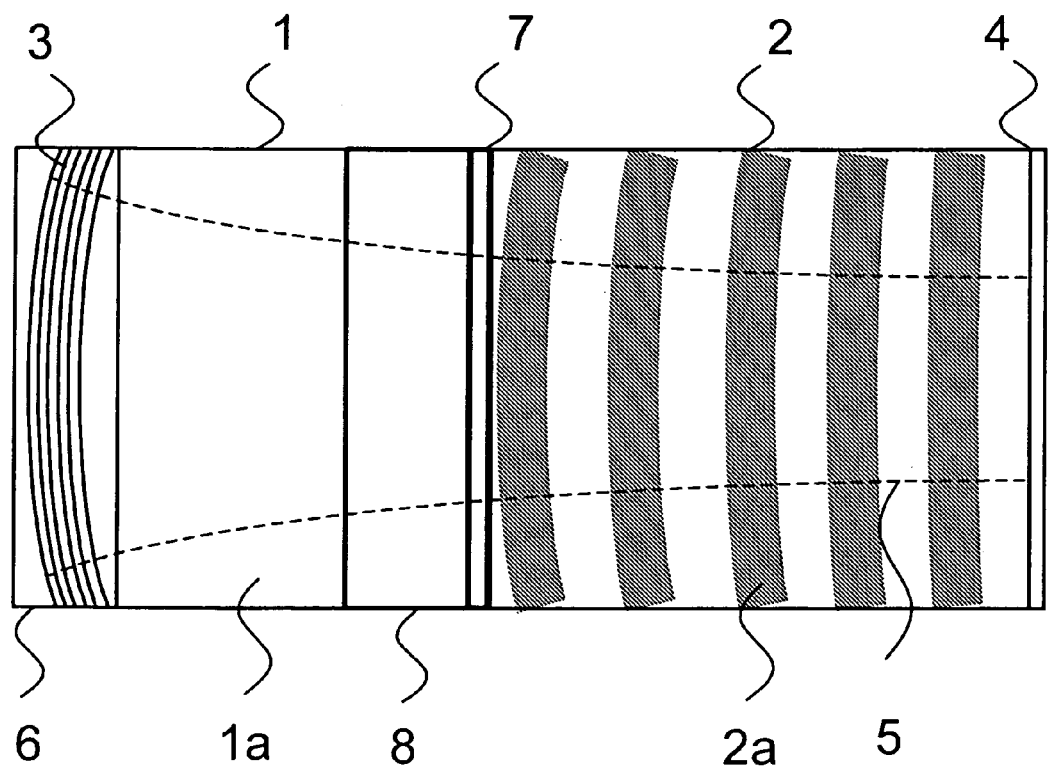
FIG. 14(b) is a cross section parallel to horizontal direction showing structure of the wavelength converting laser device in accordance with the seventh embodiment of the invention.

A wavelength converting laser device in accordance with the seventh embodiment of the invention has almost the same structure and operation as the wavelength converting laser device of embodiment 5, but includes a temperature control means for the laser diode and the wavelength converter. FIG. 13 and FIG. 14 show a structure of the wavelength converting laser device in accordance with the seventh embodiment of this invention. Here, (a) illustrates a vertical cross-sectional view of the structure of the wavelength converting laser device perpendicular to the active layer of the laser diode, and (b) illustrates a horizontal cross-sectional view of the structure of the wavelength converting laser device horizontal to the active layer of the laser diode. In addition, the same reference number indicates the same or a corresponding part in the figures.

In FIG. 13, reference number 9 indicates a temperature control means disposed to come into contact with the wavelength converter 2 and being a peltier device (thermoelectric device) changing and maintaining the temperature of the wavelength converter 2.

If the temperature control means 9 changes the temperature of the wavelength converter 2, a phase matching wavelength causes wavelength-shift due to a change of the refractive index and thermal expansion. On the other hand, the temperature of the second reflector 4 integrated with the wavelength converter 2 changes also and the reflectance spectrum cause wavelength-shift due to the change of refractive index of the grating and the thermal expansion. Then, a lasing wavelength of the laser (fundamental wave) depending on this reflectance spectrum causes wavelength-shift. Here, since the ratio of the wavelength-shift to the temperature change is different between the phase matching wavelength and the lasing wavelength, it is possible to adjust them so as to almost much the phase matching wavelength with the lasing wavelength by controlling the temperature of the wavelength converter 2. It is possible to reduce the phase mismatching amount of the harmonic and is possible to make the wavelength conversion by the wavelength converter 2 highly efficient by these adjustment. Besides, although the longitudinal mode of the laser (fundamental wave) is discrete, since the interval of the longitudinal modes of this embodiment is sufficiently small, it is possible to adjust them so as to almost much the phase matching wavelength with the lasing wavelength.

Further, in FIG. 14, the temperature control means 9 is a peltier device (thermoelectric device) disposed so as to come into contact with the laser diode 1, wavelength converter 2, and the optical waveguide device 6, which changes and maintains the temperature of them.

Based on the structure as illustrated in FIG. 14, even if ambient temperature changes, it is possible to suppress change of the refractive index and thermal expansion and possible to stabilize the high power output and high efficiency characteristic as the wavelength converting laser device, through keeping the temperature of the laser diode 1, wavelength converter 2, and the optical waveguide device 6 constant by the temperature control means 9.

By the way, if the ratio of the wavelength-shift to the temperature change at the phase matching wavelength is configured to be almost the same as that at the lasing wavelength, the conversion efficiency is kept almost constant without temperature control. Therefore, it is possible, for the structure as illustrated in FIG. 14, to counterbalance the change of refractive index due to the temperature change and influence by the thermal expansion of each element by selecting a suitable material for the optical waveguide device 6. Therefore, even if ambient temperature changes, it is possible to reduce the phase mismatching amount of the harmonic by matching the phase matching wavelength of the wavelength converter 2 with the lasing wavelength of the laser (fundamental wave) without the temperature control, and is possible to make the wavelength conversion in the wavelength converter 2 highly efficient.

Embodiment 8

Figure 15A:
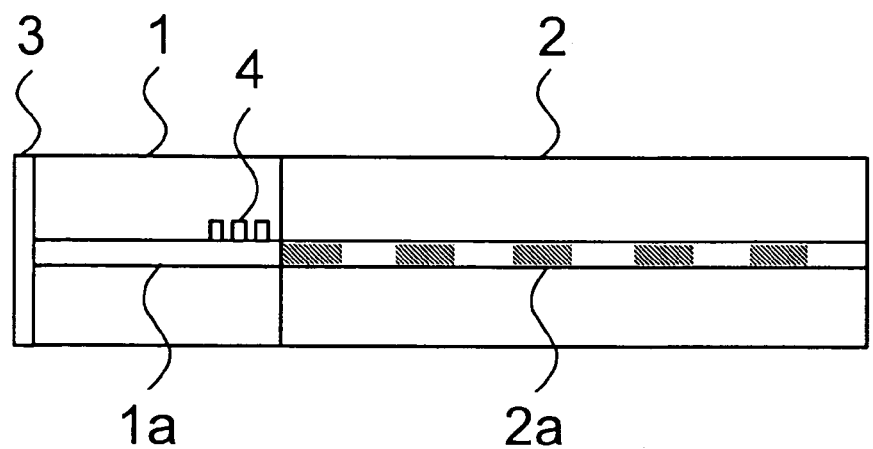
FIG. 15(a) is a cross section parallel to vertical direction showing structure of the wavelength converting laser device in accordance with an eighth embodiment of the invention.
Figure 15B:
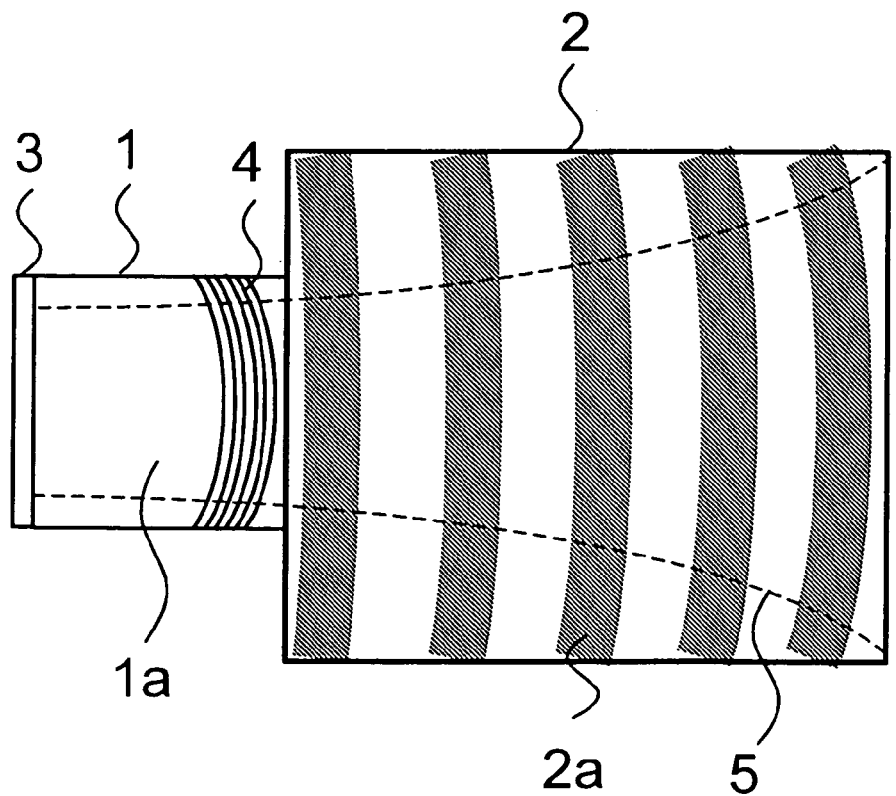
FIG. 15(b) is a cross section parallel to horizontal direction showing structure of the wavelength converting laser device in accordance with the eighth embodiment of the invention.
Figure 16:
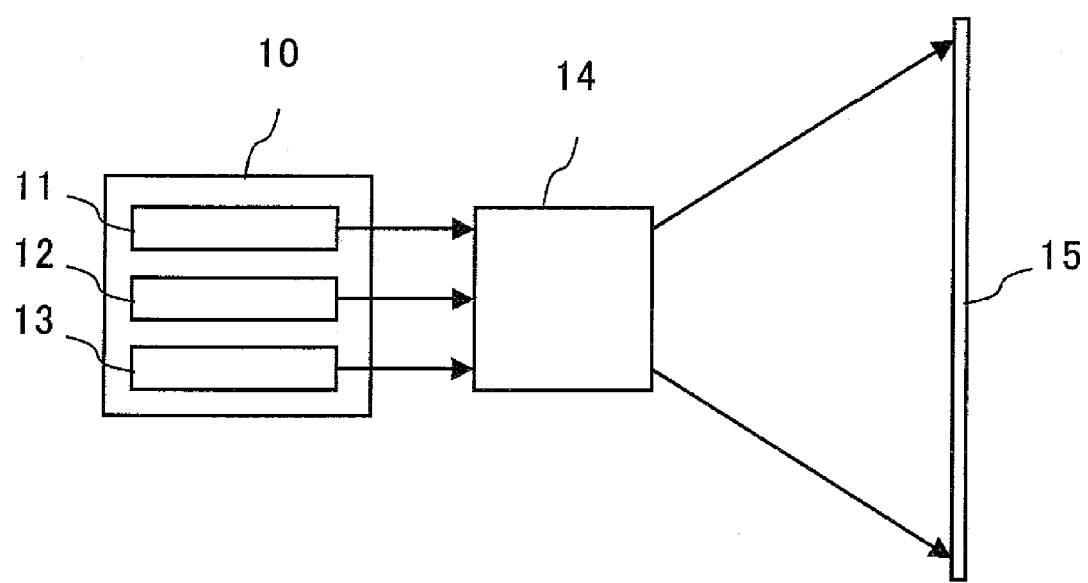
FIG. 16 is a block diagram showing structure of a display device in accordance with the ninth embodiment of the invention.

A wavelength converting laser device in accordance with the eighth embodiment of this invention includes a wavelength converter disposed outside of the laser diode and the optical resonator. A laser (fundamental wave) oscillating within the optical resonator is output after wavelength conversion into a harmonic by the wavelength converter. Vertical transverse mode of the laser (fundamental wave) and of the harmonic is controlled by an optical waveguide structure. The horizontal transverse mode of the laser (fundamental wave) is controlled by the optical resonator. FIG. 15 shows a structure of the wavelength converting laser device of the eighth embodiment of the invention. In addition, (a) illustrates a vertical cross-sectional view of the structure of the wavelength converting laser device perpendicular to an active layer of the laser diode, and (b) illustrates a horizontal cross-sectional view of the structure of the wavelength converting laser device horizontal to an active layer of the laser diode. In addition, the same reference number indicates the same or a corresponding part in the Figures.

In FIG. 15, the first reflector 3 is formed on a one facet of the laser diode 1 in an integrated structure and provides a coating which almost totally reflects light at a wavelength of 946 nm. The second reflector 4 is integrated with the laser diode 1 and is a grating which partially reflects light at a wavelength of 946 nm. Besides, the grating of the second reflector 4 has a radius of curvature in the horizontal direction in order to control the horizontal transverse mode. The wavelength converter 2 is disposed outside of the optical resonator keeping in touch with a one facet of the laser diode 1.

Next, operation of the embodiment is explained.

Like the embodiment 1, laser oscillation occurs when amplification gain of the laser exceeds resonator loss, including absorption in the laser diode 1 and transmission loss in the first reflector 3 and the second reflector 4.

At this moment, in the laser diode 1, the vertical transverse mode of the laser (fundamental wave) is controlled by the active layer 1a. In the wavelength converter 2, the vertical transverse mode of the laser (fundamental wave) and of the harmonic is controlled by the slab waveguide 2a. On the other hand, the horizontal transverse mode of the laser (fundamental wave) and of the harmonic is not controlled by the active layer 1a and the slab waveguide 2a. The horizontal transverse mode of the laser (fundamental wave) is controlled by the first reflector 3 and the second reflector 4 which has the radius of curvature. Here, the spatial mode of the optical resonator is governed by the radius of curvature of the second reflector 4. The laser (fundamental wave) having a horizontal transverse mode with low loss in optical resonator oscillates and a wavefront of the laser (fundamental wave) at the second reflector 4 becomes almost parallel to the reflecting surface.

Here, the broad-area laser diode 1 has a high power output characteristic. It is possible to prevent optical damage and temperature rise at the wavelength converter 2 from occurring by decreasing the power density of the laser (fundamental wave) by expanding the beam dimension in the horizontal direction. Thus, the harmonic can have a high-power. Both of the laser diode 1 and the wavelength converter 2 have an optical waveguide structure. It is possible to make the wavelength conversion in the wavelength converter 2 highly efficient by matching, in the vertical direction, the waveguide mode of the optical waveguide comprising the laser diode 1 and the wavelength converter 2, and by decreasing, in the horizontal direction, coupling loss of the laser (fundamental wave) traveling between the laser diode 1 and the wavelength converter 2, as the spectral mode comprising the optical resonator including the pair of the reflectors.

As to the laser (fundamental wave) traveling back and forth within the optical resonator, its polarization is defined in the horizontal direction. Therefore, it is possible to make the wavelength conversion in the wavelength converter highly efficient by aligning the z-axis of crystal axis having the greatest nonlinear coefficient of wavelength converter 2 with the direction of polarization of the laser (fundamental wave). In addition, because the wavelength converter 2 has the periodically domain-inversed structure, quasi-phase matching arises for the propagating harmonic, so it is possible to make the wavelength conversion in the wavelength converter 2 highly efficient. Furthermore, the periodically domain-inversed structure is formed, along with a direction which the beam propagates, to be almost parallel to the wavefront of the laser (fundamental wave) in the horizontal direction. Thus, since this makes the angle-turned phase matching sufficient, it is possible to make the wavelength conversion in the wavelength converter 2 highly efficient.

The interval of the longitudinal mode of the laser (fundamental wave) depends on length of the optical resonator and is 0.13 nm. As a lasing wavelength of the laser, a longitudinal mode, around the wavelength of 946 nm, within the wavelength bandwidths of reflectance spectra of the first reflector 3 and the second reflector 4 is selected. In order to select the longitudinal mode, the second reflector 4 includes the grating. Therefore, it is possible to make the wavelength conversion in the wavelength converter 2 highly efficient by reducing the phase mismatch of the harmonic by matching the phase matching wavelength of the wavelength converter 2 and the lasing wavelength of the laser (fundamental wave).

Embodiment 9

A display device in accordance with the ninth embodiment of this invention uses any one of the wavelength converting laser device in accordance with embodiments 1-8 as a light source 10 to generate images. The display device of this invention modulates a laser from a high-intensity light source 10 by an optical modulating means 14 and projects them to generate images on a screen 15. For example, among three elementary colors, a wavelength converting laser device 11 having a 3 Watt power output at a wavelength of 473 nm is used for a blue light source and a wavelength converting laser device 12 having a 2 Watt power output at a wavelength of 532 nm is used for a green light source. Besides, among the three elementary colors, as a red light source, laser diode device 13 is used.

Further, as the optical modulating means 14, a liquid crystal or a digital reflecting element DMD (Digital Micro-mirror Device) is used. In a liquid crystal display device using the liquid crystal as the optical modulating means 14, an element is made by holding a liquid crystal material between, for example, glass substrates and images are generated by utilizing the change of optical property of the element, caused with change of the molecular arrangement of the liquid crystal, caused by applying an external electric field.

Also, in a micro-mirror display device using the DMD as the optical modulating means 14, images are generated by arranging, in two-dimensions, micro-mirrors produced by MEMS technology (Micro Electro Mechanical Systems) and by on-off driving through swinging each mirror.

When the wavelength converting laser device is used as a light source for generating images, since it has an advantage of monochromatic output and high intensity of the laser compared with conventional lamp apparatuses, it is possible to improve the usability of light energy in generation of images by the optical modulating means. Besides, since the wavelength converting laser device has an advantage such as higher efficiency and longer operating life compared with conventional lamp apparatuses, it is possible to make the display device energy conserving and have a longer operating time.

What is claimed is:

1. A wavelength converting laser device comprising:
a laser light producing unit producing laser light;
an optical resonator having facing first and second reflectors; and
a wavelength converter disposed within the optical resonator and converting the laser light into harmonic light, the wavelength converter including a slab optical waveguide structure controlling vertical transverse mode of the laser light and controlling vertical transverse mode of the harmonic light, wherein one of the facing first and second reflectors includes a distributed-reflectance-Bragg-grating-reflector integral with the laser light producing unit.

2. A wavelength converting laser device comprising:
an optical resonator having facing first and second resonators and in which light resonates to produce laser light; and
a wavelength converter disposed within the optical resonator and converting the laser light into harmonic light, the wavelength converter including a slab optical waveguide structure controlling vertical transverse mode of the laser light and controlling vertical transverse mode of the harmonic light, wherein one of the first and second reflectors includes a coating on a facet of the wavelength converter having a curved surface shape that is convex toward a direction outside of the optical resonator.

3. A wavelength converting laser device comprising:

a laser light producing unit producing laser light;

an optical resonator having facing first and second reflectors;

a wavelength converter disposed within the optical resonator and converting the laser light into harmonic light, the wavelength converter including a slab optical waveguide structure controlling vertical transverse mode of the laser light and controlling vertical transverse mode of the harmonic light; and a third reflector, for reflecting the harmonic light, disposed between the laser light producing unit and the wavelength converter.

4. A wavelength converting laser device comprising:

a laser light producing unit producing laser light;

an optical resonator having facing first and second reflectors;

a wavelength converter disposed within the optical resonator and converting the laser light into harmonic light, the wavelength converter including a slab optical waveguide structure controlling vertical transverse mode of the laser light and controlling vertical transverse mode of the harmonic light; and transverse mode converting means for reducing mode mismatching between a vertical transverse mode of the laser light in the laser light producing unit and a vertical transverse mode of the laser light in the wavelength converter.

5. A wavelength converting laser device of comprising:

a laser light producing unit producing laser light;

an optical resonator having facing first and second reflectors;

a wavelength converter disposed within the optical resonator and converting the laser light into harmonic light, the wavelength converter including a slab optical waveguide structure controlling vertical transverse mode of the laser light and controlling vertical transverse mode of the harmonic light; and temperature control means for controlling temperature of the laser light producing unit and temperature of the wavelength converter.

6. A wavelength converting laser device of comprising:

a laser light producing unit producing laser light;

an optical resonator having facing first and second reflectors; and a wavelength converter disposed within the optical resonator and converting the laser light into harmonic light, the wavelength converter including a slab optical waveguide structure controlling vertical transverse mode of the laser light and controlling vertical transverse mode of the harmonic light, wherein a ratio of a wavelength-shift to temperature change at a lasing wavelength of the laser light of the laser light producing unit is substantially the same as a ratio of a wavelength-shift to temperature change at a phase matching wavelength of the laser light of the wavelength converter.

7. A display device comprising:

a light source producing light;

an optical resonator having facing first and second reflectors, and in which the light resonates to produce laser light;

a wavelength converter disposed within the resonator and converting the laser light into harmonic light, the wavelength converter including a slab optical waveguide structure controlling vertical transverse mode of the laser light and controlling vertical transverse mode of the harmonic light: and a third reflector, for reflecting the harmonic light, and disposed between the laser light producing unit and the wavelength converter, wherein the wavelength converter produces light for generating an image.

8. The display device of claim 7, wherein the light source for generating an image is a source of green light.

9. The display device of claim 7, wherein the light source for generating an image is a source of blue light.

10. The display device of claim 7, further comprising a liquid crystal material as optical modulating means for generating an image.

11. The display device of claim 7, further comprising digital reflecting means as optical modulating means for generating an image.

* * * * *